(12) United States Patent
Kung et al.

(10) Patent No.: US 11,296,043 B2
(45) Date of Patent: Apr. 5, 2022

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Cheng-Yuan Kung, Kaohsiung (TW); Hung-Yi Lin, Kaohsiung (TW); Chang-Yu Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/703,409

(22) Filed: Dec. 4, 2019

(65) Prior Publication Data

US 2021/0175189 A1  Jun. 10, 2021

(51) Int. Cl.
*H01L 23/367* (2006.01)
*H01L 23/64* (2006.01)
*H01L 23/00* (2006.01)
*H01L 21/56* (2006.01)

(52) U.S. Cl.
CPC .............. *H01L 24/05* (2013.01); *H01L 21/56* (2013.01); *H01L 23/367* (2013.01); *H01L 23/645* (2013.01); *H01L 24/03* (2013.01); *H01L 2224/02371* (2013.01)

(58) Field of Classification Search
CPC .................. H01L 23/645; H01L 23/367; H01L 2224/02371
See application file for complete search history.

(56) References Cited

U.S. PATENT DOCUMENTS

| | | | |
|---|---|---|---|
| 2017/0025363 A1* | 1/2017 | Tsai | H01L 21/4853 |
| 2017/0288780 A1 | 10/2017 | Yim et al. | |
| 2018/0120525 A1* | 5/2018 | Leigh | G02B 6/4274 |
| 2018/0342472 A1* | 11/2018 | Dogiamis | H01L 24/16 |
| 2019/0006291 A1* | 1/2019 | Neal | H01L 21/565 |

\* cited by examiner

*Primary Examiner* — Dale E Page
*Assistant Examiner* — Wilner Jean Baptiste
(74) *Attorney, Agent, or Firm* — Foley & Lardner LLP

(57) ABSTRACT

A semiconductor device package includes a redistribution layer (RDL), a semiconductor device, a transceiver, and a capacitor. The RDL has a first surface and a second surface opposite to the first surface. The semiconductor device is disposed on the first surface of the RDL. The transceiver is disposed on the second surface of the RDL. The capacitor is disposed on the second surface of the RDL. The semiconductor device has a first projected area and the capacitance has a second projected area. The first projected area overlaps with the second projected area.

19 Claims, 11 Drawing Sheets

SEMICONDUCTOR DEVICE PACKAGES AND METHODS OF MANUFACTURING THE SAME

BACKGROUND

1. Field of the Disclosure

The present disclosure relates to semiconductor device packages and methods of manufacturing the same.

2. Description of Related Art

Owing to the high transmission rate and reduced power consumption specifications for optical communication, it is desired to reduce the electrical transmission path between processor, power device, and transceiver. A comparative semiconductor device package including a substrate with a processor and transceiver disposed on the same side of the substrate can shorten the electrical transmission path. However, given that the processor and the transceiver are juxtaposed on the same side or same surface of the substrate, distance tolerance between the processor and the transceiver shall be preserved for the bonding process. Therefore, the electrical transmission path between the processor and the transceiver cannot be effectively reduced.

SUMMARY

According to some embodiments of the present disclosure, a semiconductor device package includes a redistribution layer (RDL), a semiconductor device, a transceiver, and a capacitor. The RDL has a first surface and a second surface opposite to the first surface. The semiconductor device is disposed on the first surface of the RDL. The transceiver is disposed on the second surface of the RDL. The capacitor is disposed on the second surface of the RDL. The semiconductor device has a first projected area and the capacitance has a second projected area. The first projected area overlaps with the second projected area.

According to some embodiments of the present disclosure, a semiconductor device package includes a substrate, a redistribution layer (RDL), a semiconductor device, a transceiver, and a power supply. The substrate has a first surface and a second surface opposite to the first surface. The RDL is disposed on the first surface of the substrate. The semiconductor device is disposed on the RDL. The transceiver is disposed on the second surface of the substrate. The power supply, disposed on the second surface of the substrate, is electrically connected to the semiconductor device and the transceiver through the substrate.

According to some embodiments of the present disclosure, a method of manufacturing a semiconductor device package includes providing a redistribution layer (RDL), the RDL having a first surface and a second surface opposite to the first surface; disposing a semiconductor device on the first surface of the RDL, the semiconductor device projecting a first area on the RDL; forming an encapsulant encapsulating the semiconductor device; disposing a transceiver on the second surface of the RDL; and disposing a capacitor over the second surface of the RDL and adjacent to the transceiver, the capacitor projecting a second area on the RDL, wherein the first area overlaps the second area.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
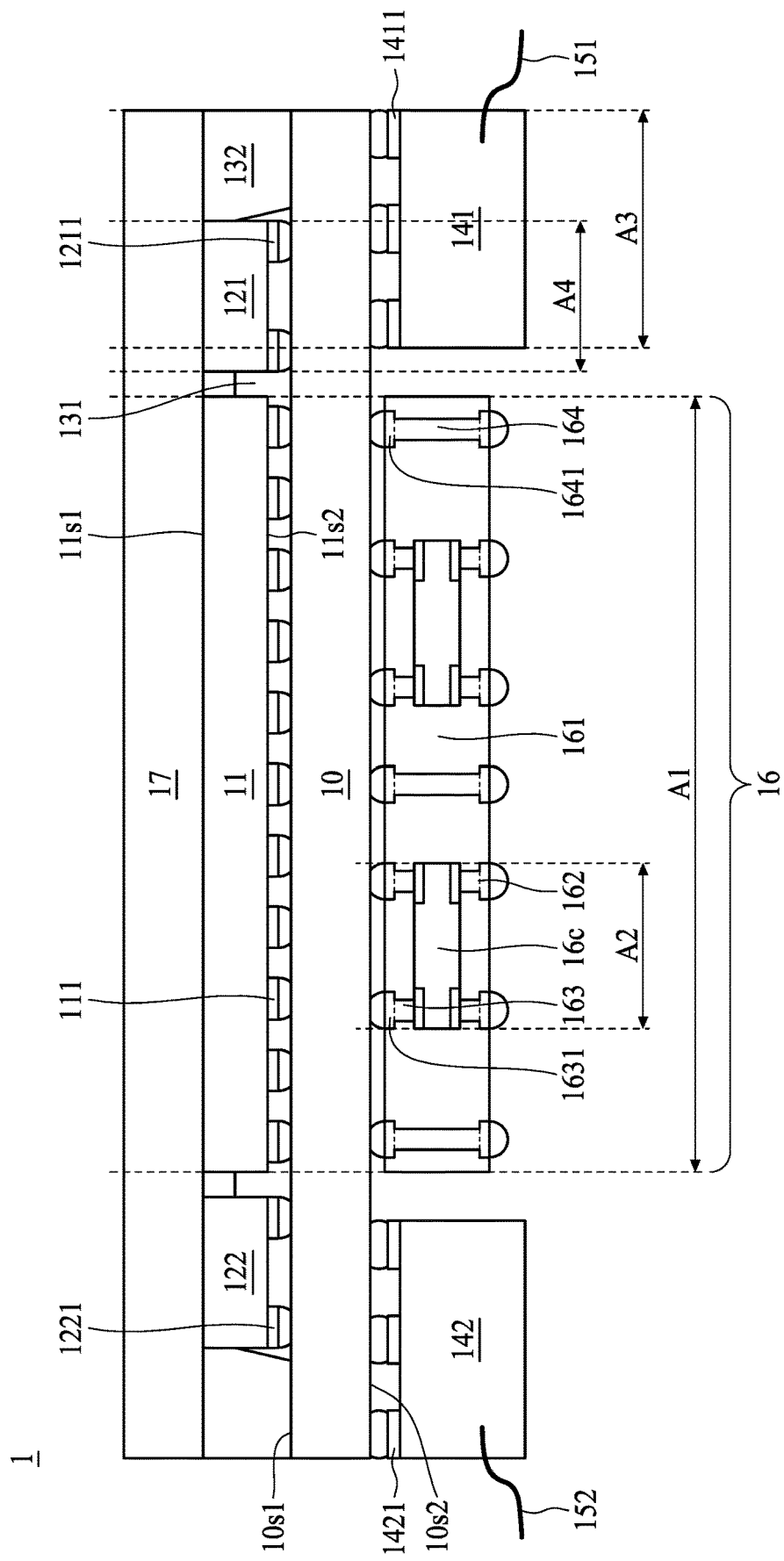
FIG. 1 illustrates a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

The electrical transmission path in a wiring configuration significantly affects transmission rate and power consumption of an electrical communication system. For example, a long electrical transmission path decreases transmission rate and increases power consumption. Reducing the electrical transmission path in an optical communication system may increase the transmission rate and decrease power consumption. The optical communication system may include an optical fiber providing an optical transmission path for carrying optical signals In a photonic integrated system, a transceiver is used as an interface to convert the optical signal to an electrical signal for entering an electronic device via an electrical transmission path. Similarly, the transceiver may also convert the electrical signal to optical signal for entering an optical device via an optical transmission path. Since the constraining factor of transmission rate and power consumption in the aforesaid photonic integrated system is the total length of electrical transmission path, reducing the electrical transmission path between the electronic device and the transceiver becomes a major focus in this technical field.

In some comparative embodiments, a semiconductor device is disposed on a core portion of a system printed circuit board (PCB) and a transceiver is disposed on a periphery portion of the system PCB to shorten the electrical transmission path. In some comparative embodiments, the transceiver may be disposed on the core portion of the system PCB, for example, sharing a same substrate with a processor, to further shorten the electrical transmission path. However, given that the semiconductor device and the transceiver are juxtaposed to the same surface or same side of the system PCB, a distance tolerance between the semiconductor device and the transceiver for the attaching process shall be preserved, so that the electrical transmission path between the semiconductor device and the transceiver remains relatively long. For example, the electrical transmission path may be more than 3 cm, more than 10 cm, or more than 30 cm.

Present disclosure provides a semiconductor device package including a redistribution layer (RDL), a semiconductor device disposed on a first surface of the RDL, and a transceiver and a capacitor disposed on a second surface of the RDL to improve the transmission rate and the power consumption. The semiconductor device and the transceiver have an electrical transmission path therebetween via the RDL, which is shorter than the electrical transmission path in the comparative embodiments as discussed. The electrical transmission path via the RDL is less than, for example, 1 cm. Consequently, the transmission rate and power consumption of the semiconductor device package can be improved. Furthermore, disposition of the capacitors on the second surface of the RDL realizes a shorter decoupling path between the semiconductor device and capacitors via the RDL. The decoupling path may be less than, for example, 1 cm. The relatively short decoupling path improves decoupling efficiency and charge storage efficiency of the capacitor. In other embodiments, the semiconductor device package further includes a substrate (e.g., a carrier) supporting the RDL. A power supply may be further disposed on a surface of the substrate opposite to the surface receiving the semiconductor device. The semiconductor device and the power supply have a power transmission path therebetween via the substrate and the RDL. The power transmission path is less than, for example, 1 cm, such that power consumption by the power transmission path is significantly reduced.

FIG. 1 is a cross-sectional view of a semiconductor device package 1 in accordance with some embodiments of the present disclosure. Referring to FIG. 1, the semiconductor device package 1 includes a redistribution layer (RDL) 10, a semiconductor device 11, a first multiplexer 121, a second multiplexer 122, a first transceiver 141, a second transceiver 142, a first optical fiber 151, and a second optical fiber 152, a decoupling capacitor structure 16, and a heat dissipation structure 17.

The RDL 10 may include one or more redistribution layers and insulation material(s) or dielectric material(s) (not denoted in FIG. 1) encapsulating the one or more redistribution layers. The RDL 10 may include a fan-out layer. The RDL structure 10 may include conductive trace(s), pad(s), contact(s), and via(s) (collectively referred as conductive elements hereafter) to electrically connect the one or more redistribution layers, or electrically connect the RDL structure to one or more semiconductor devices or electronic components directly or indirectly disposed thereon.

The semiconductor device 11 is disposed on the first surface $10s1$ of the RDL 10. The semiconductor device 11 is electrically connected with the RDL 10 via a conductive terminal 111. The semiconductor device 11 may be, for example, a processor (e.g. a switch processor), a controller (e.g. a memory controller), a microcontroller (MCU), a memory die, a high speed input/output device or other electronic component(s). In some embodiments, the first and second multiplexers 121 and 122 are disposed on first surface $10s1$ of the RDL 10. The first multiplexer 121 is electrically connected with the semiconductor device 11 and the first transceiver 141. The second multiplexer 122 is electrically connected with the semiconductor device 11 and the second transceiver 142. The first and second multiplexers 121 and 122 may be, for example, an analog to digital converter, a digital to analog converter, or a Serializer/Deserializer (SerDes). In some embodiments, the semiconductor device 11 may be integrated with the multiplexers and form a single component over the first surface $10s1$ of the RDL 10.

One or more first transceivers 141 can be disposed on a second surface $10s2$ of the RDL 10 opposite to the first surface $10s1$. The first transceiver 141 is electrically connected with the multiplexer 121 via an electrical transmission path in the RDL 10. The electrical transmission path may be composed of the conductive elements and the redistribution layers in the RDL 10. The first multiplexer 121 has a projected area A4 and the first transceiver 141 has a projected area A3. The projected area A3 at least partially overlaps with the projected area A4. The partially overlapping arrangement of the first multiplexer 121 and the first transceiver 141 shortens the electrical transmission path connected therebetween. Since the first multiplexer 121 is disposed on the first surface $10s1$ of the RDL 10 and the first transceiver 141 is disposed on the second surface $10s2$ of the RDL 10 opposite to the first surface $10s1$, no distance tolerance between the first multiplexer 121 and the first transceiver 141 is required because they can be stacked vertically and at least partially overlapping. In addition, the electrical transmission path between the first multiplexer 121 and the first transceiver 141 is shorter than that of the comparative embodiments. For example, the electrical transmission path may be less than 1 cm. Consequently, the transmission rate and power consumption of the semiconductor device package 1 is improved.

The first transceiver 141 receives a first optical signal from the optical fiber 151. The first optical fiber 151 is engaged with the first transceiver 141. In some embodiments, the first transceiver 141 includes a photonic integrated circuit (PIC) coupled to the first optical fiber 151 to convert the optical signal to a first electrical signal (e.g. an analog signal). The first transceiver 141 may also include an electronic integrated circuit (EIC) to drive the first electrical signal to the first multiplexer 121 via the electrical transmission path in the RDL 10. In some embodiments, the first electrical signal may be transmitted directly to the semiconductor device 11 since the electrical routing in the RDL 10 may electrically connect the first multiplexer 121 to the semiconductor device 11.

In a similar and sequentially reverse manner, the second transceiver 142 receives a second electrical signal from the second multiplexer 122 via the electrical transmission path in the RDL 10. An EIC of the second transceiver 142 drives the second electrical signal to a PIC of the second transceiver 142. The PIC of the second transceiver 142 in turn provides an initiating signal to a laser source of the second transceiver 142 based on the second electrical signal. Subsequently, the laser source outputs a second optical signal associated with the second electrical signal into the second optical fiber 152. The second optical fiber 152 is engaged with the second transceiver 142.

The first and second transceivers 141 and 142 may each have a height about 1 mm, or in a range from about 600 μm to about 700 μm. In some embodiments, the first transceiver 141 may have function similar to the second transceiver 142.

A first conductive terminal 1211 proximal to the first surface 10s1 of the RDL 10 connects the first multiplexer 121 to the RDL 10. A second conductive terminal 1411 proximal to the second surface 10s2 of the RDL 10 connects the first transceiver 141 to the RDL 10. The first conductive terminal 1211 is finer in dimension than the second conductive terminal 1411. A third conductive terminal 1221 proximal to the first surface 10s1 of the RDL 10 connects the second multiplexer 122 to the RDL 10. A fourth conductive terminal 1421 proximal to the second surface 10s2 of the RDL 10 connects the second transceiver 142 to the RDL 10. The third conductive terminal 1221 is finer in dimension than the fourth conductive terminal 1421.

The decoupling capacitor structure 16 is disposed on the second surface 10s2 and includes at least a capacitor 16c embedded therein. The capacitor 16c may decouple the semiconductor device 11 from the peripheral circuitry (not shown) via a decoupling path in the RDL 10. Noise caused by peripheral circuitry may be shunted through the capacitor 16c to avoid interference. For example, the capacitor 16c may prevent the semiconductor device 11 from being affected by a spiking current in the peripheral circuitry, and in addition, the capacitor 16c may store charges and serving as a spare power supply. The semiconductor device 11 has a first projected area A1 and the capacitor 16c has a second projected area A2. The first projected area A1 overlaps with the second projected area A2. The decoupling path between the capacitor 16c and the semiconductor device 10 is relatively short, for example, shorter than 1 cm. In some comparative embodiments, the semiconductor device 11 is decoupled by an external capacitor integrated on the same surface of the carrier and which does not have a projected area overlapping with a projection area of the semiconductor device 11. The decoupling path of the comparative embodiments is relatively long, for example, more than 10 cm. In contrast, the overlapping arrangement disclosed in FIG. 1 provides a relatively short decoupling path, therefore decoupling efficiency and charge storage efficiency of the capacitor 16c are improved.

The semiconductor device 11 is disposed between the first and second multiplexers 121 and 122. Meanwhile, the decoupling capacitor structure 16 is disposed between the first and second transceivers 141 and 142. In some embodiments, the semiconductor device 11, the first and second multiplexers 121 and 122 substantially align with the decoupling capacitor structure 16 and the first and second multiplexers 141 and 142, respectively. Such an overlapping arrangement achieves a relatively short distance between the elements on the first surface 10s1 and the elements on the second surface 10s2, so that the electrical transmission path or the decoupling path can be further reduced.

Referring to FIG. 1, the decoupling capacitor structure 16 further includes a dielectric layer 161, and first, second, and third conductive elements 162, 163, and 164. The first conductive element 162 contacts a first surface of the capacitor 16c. The second conductive element 163 contacts a second surface of the capacitor 16c. The conductive element 163 includes a fifth conductive terminal 1631 proximal to the second surface 10s2 of the RDL 10. The fifth conductive terminal 1631 connects the RDL 10 to the decoupling capacitor structure 16. The third conductive element 164 extends from a first surface of the dielectric layer 161 to a second surface of the dielectric layer 161. The third conductive element 164 includes a sixth conductive terminal 1641 proximal to the second surface 10s2 of the RDL 10. The sixth conductive terminal 1641 connects the RDL 10 to the decoupling capacitor structure 16. The seventh conductive terminal 111, proximal to the first surface 10s1 of the RDL 10, connects the semiconductor device 11 to the RDL 10. The seventh conductive terminal 111 is finer in dimension than the fifth conductive terminal 1631 or the sixth conductive terminal 1641. In some embodiments, the seventh conductive terminal 111 may have a pitch of 130 μm and fifth and sixth conductive terminals may each have a pitch of 300 μm. In some embodiments, the decoupling capacitor structure may have a height of about 50 μm or 100 μm. In some embodiments, the conductive terminals as discussed may include a solder.

The underfill 131 surrounds the semiconductor device 11 and the first and second multiplexers 121 and 122. In some embodiments, the underfill 131 includes an epoxy resin, a molding compound, a polyimide, or a combination thereof. The encapsulant 132 encapsulates the semiconductor device 11, the first and second multiplexers 121 and 122, and the underfill 131. The encapsulant 132 may include insulation or dielectric material. In some embodiments, the encapsulant 13 be molding material that may include, for example, an epoxy resin, or other suitable encapsulant.

The heat dissipation structure 17 is disposed on the semiconductor device 11, and comprises a planar bottom profile. The heat generated from the semiconductor device may be dissipated through the heat dissipation structure 17. The heat dissipation structure 17 may directly contact a first surface 11s1 of the semiconductor device 11, such that heat dissipation efficiency is improved. The heat dissipation structure 17 may be, for example, a pipe, a fin type heat sink, a planar heat sink, a thermal interface material, a liquid cooling tube, or a thermal vapor compressor (TVC).

Although FIG. 1 illustrates the semiconductor devices, it is contemplated that the semiconductor device package 1 as shown in FIG. 1 may include more than one semiconductor device as discussed previously.

Figure 2:
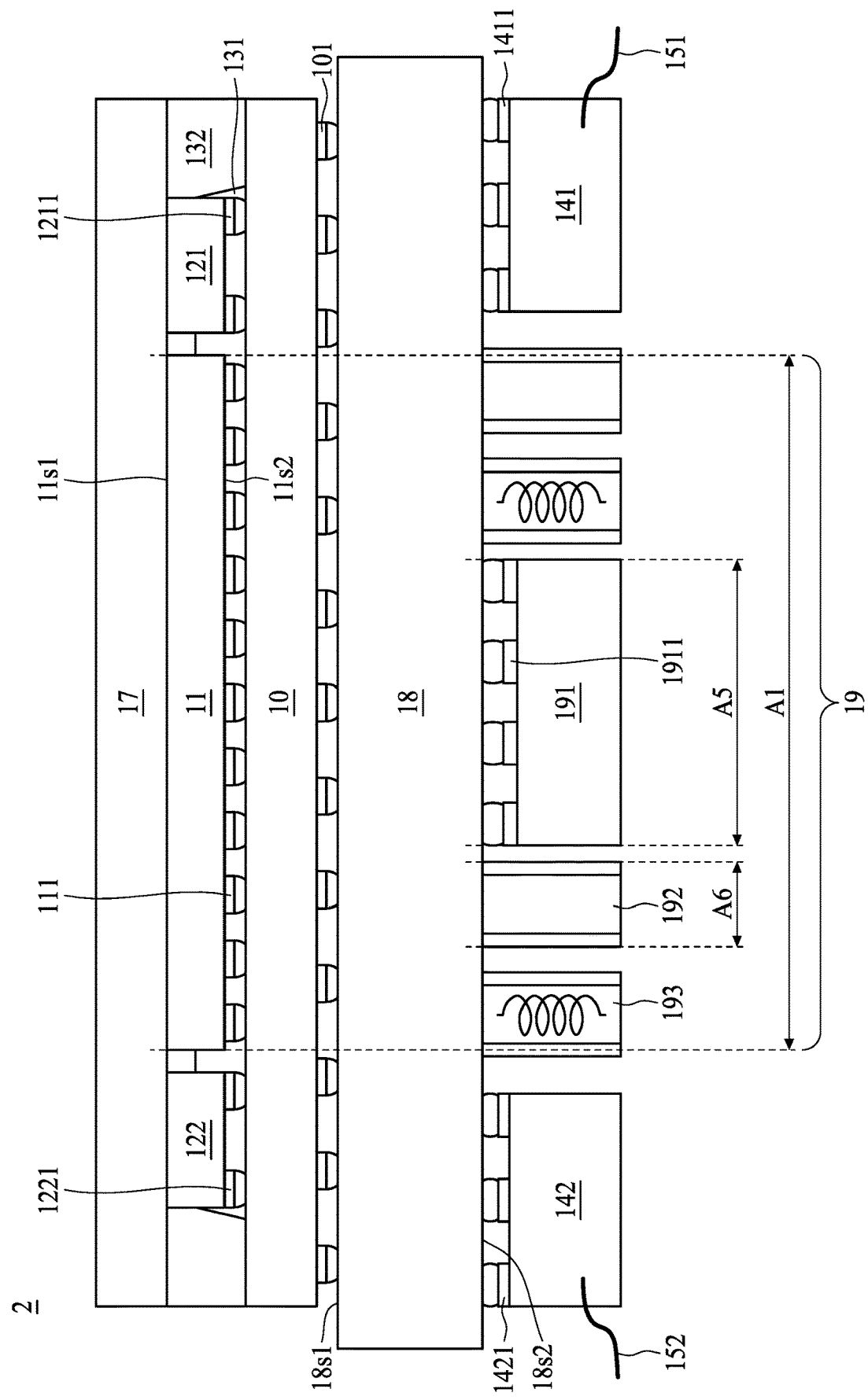
FIG. 2 illustrates a cross-sectional view of another semiconductor device package in accordance with some embodiments of the present disclosure.

FIG. 2 is a cross-sectional view of another semiconductor device package 2 in accordance with some embodiments of the present disclosure. Referring to FIG. 2, the semiconductor device package 2 may be similar to the semiconductor device package 1 as described and illustrated with reference labels identical to FIG. 1, except that the RDL 10 is attached on a first surface 18s1 of a substrate 18 (or a carrier). A power management circuit 19 is further disposed on a second surface 18s2 of the substrate 18 opposite to the first surface 18s1. The first and second transceivers 141 and 142 are disposed on the second surface 18s2 of the substrate 18. The power management circuit 19 disposed between first and second transceivers 141 and 142.

The substrate 18 may include, for example, a printed circuit board, such as a paper-based copper foil laminate, a composite copper foil laminate, or a polymer-impregnated glass-fiber-based copper foil laminate. The substrate 18 may include a through silicon via (TSV) structure or other connection structures to electrically connect an electronic component on the first surface 18s1 with another electronic component on the second surface 18s2.

The power management circuit 19 includes a power supply 191 and a plurality of capacitors 192 and plurality of inductors 193 surrounding the power supply 191. One of the plurality of inductors 193 electrically couples with one of the plurality of capacitors 192. The plurality of capacitors 192 and the plurality of inductors 193 regulate an output voltage of the power supply 191, for example, by decreasing the ripples of the output voltage. The power supply 191 electrically couples to the semiconductor device 11 and the first and second transceivers 141 and 142 through the substrate 18 and the RDL 10. The power supply 191 provides power to the semiconductor device 11 via the substrate 18 and the RDL 10. The power supply 191 has a fifth projected area A5 overlapping with the first projected area A1 of the semiconductor device 11. Such an overlapping arrangement achieves a relatively short distance between the semiconductor device 11 and the power supply 191, so that the power transmission path between the power supply 191 and the semiconductor device 10 is relatively short, for example, less than 1 cm. The shorter power transmission path improves power transmission efficiency and reduces power consumption. In some comparative embodiments, the semiconductor device 11 is supplied by an external power supply disposed on the same side of the carrier or substrate and which does not have a projected area overlapping with that of the semiconductor device 11. The power transmission path of the comparative embodiments is relatively long, for example, more than 10 cm. In contrast, the arrangement disclosed in FIG. 2 provides a relatively short power transmission path (e.g. less than 1 cm), so that power consumption or power loss can be reduced.

In some embodiments, the plurality of capacitors 192 may be surface mounted devices (SMD) capacitors. In some embodiments, the plurality of inductors 193 may be SMD inductors. The power supply 191, the plurality of capacitors 192, and the plurality of inductors 193 may each have a height of about 600 µm or more than 1.2 mm.

In some embodiments, the substrate 18 may provide sufficient mechanical support to the RDL 10, the semiconductor device 11, the first and second transceivers 141 and 142, the power supply 191, and/or the plurality of capacitors 192.

Referring to FIG. 2, the first and second multiplexers 121 and 122 are disposed over the substrate 18 and at least partially overlap the first and second transceivers 141 and 142 in a direction vertical to the first surface 18s1 of the substrate 18, respectively. Therefore, the first multiplexer 121 and the first transceiver 141 have a relatively short electrical transmission path as similarly depicted in FIG. 1.

Still referring to FIG. 2, the capacitor 192 has a sixth projected area A6 overlapping the first projected area A1 of the semiconductor device 11. Therefore, the capacitor 192 may have a relatively short decoupling path to the semiconductor device 11 as depicted in FIG. 1.

The heat dissipation structure 17 dissipates the heat generated from the semiconductor device 11 as well as the power management circuit 19 to the external environment (e.g. a frame or air).

In some embodiments, the present disclosure provides a semiconductor device package including a substrate 18, a RDL 10, a semiconductor device 11, a first transceiver 141, and a power supply 191 as illustrated in FIG. 2. The substrate 18 has a first surface 18s1 and a second surface 18s2 opposite thereto. The RDL 10 is disposed on the first surface 18s1 of the substrate 18. The semiconductor device 11 is disposed on the RDL 10. The first transceiver 141 is disposed on the second surface 18s2 of the substrate 18. The power supply 191 is disposed on the second surface 18s2 of the substrate 18. The power supply 191 is electrically connected to the semiconductor device 11 and the first transceiver 141 through the substrate 18. The semiconductor device package further includes an decoupling capacitor structure 16 as illustrated in FIG. 1 disposed on the second surface 18s2 of the substrate 18. The decoupling capacitor structure 16 comprises a capacitor 16c electrically connected with the semiconductor device 11.

In some embodiments, the present disclosure provides another semiconductor device package similar to the semiconductor device package 2 except that the substrate 18 is omitted. The first and second transceivers 141 are directly disposed on the RDL 10. The power supply 191, the plurality of capacitors 192, and the plurality of inductors 193 of the power management circuit 19 are directly disposed on the second surface 10s2 of the RDL 10.

Figure 3:
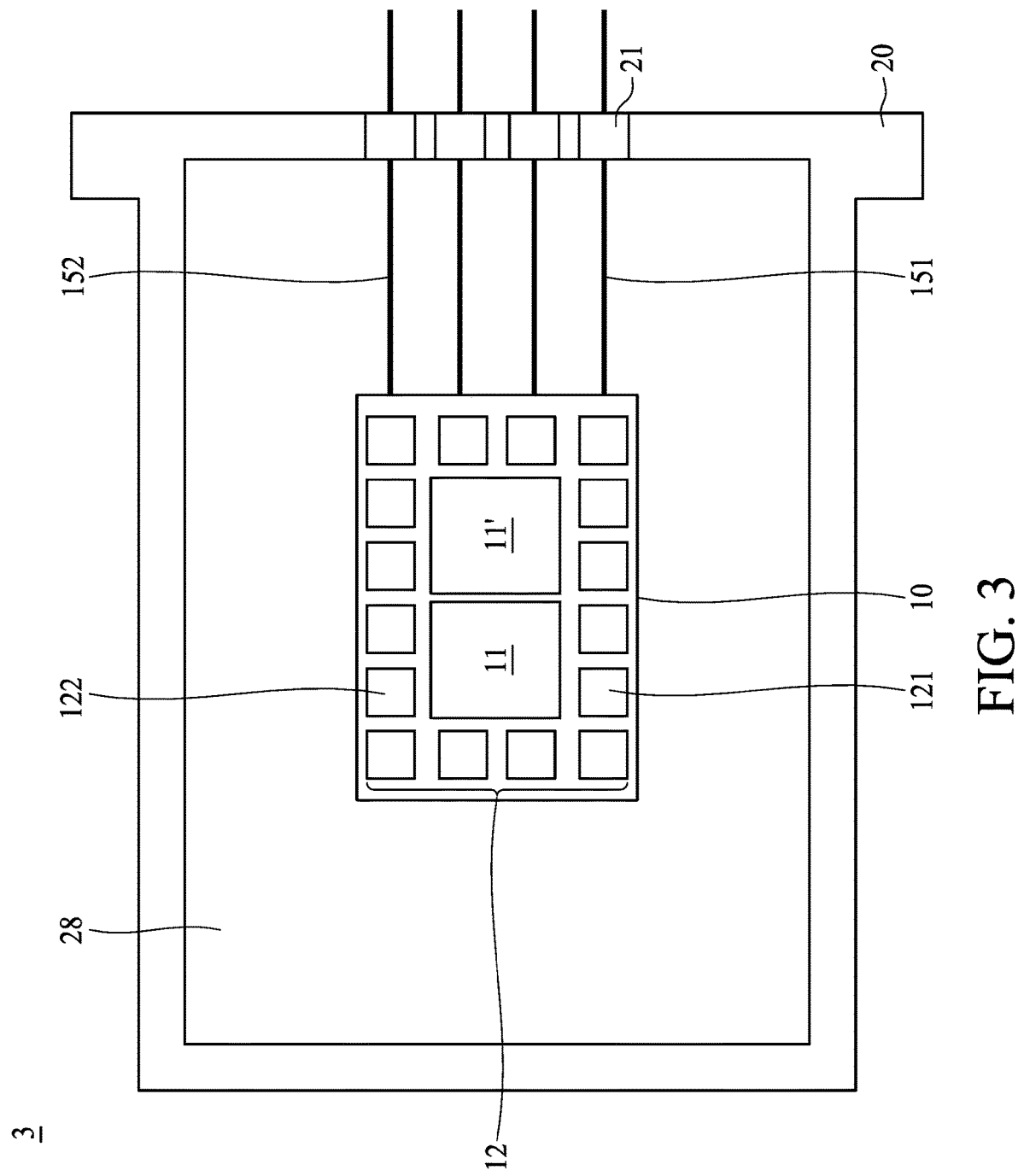
FIG. 3 illustrates a top view of another semiconductor device package in accordance with some embodiments of the present disclosure.

FIG. 3 illustrates a top view of another semiconductor device package 3 in accordance with some embodiments of the present disclosure. Referring to FIG. 3, the semiconductor device package 3 includes a semiconductor device 11 and a semiconductor device 11' disposed on the RDL 10 and adjacent to the semiconductor device 11. A plurality of multiplexers 12 disposed on the RDL 10 surrounds semiconductor devices 11 and 11'. In some embodiments, the plurality of multiplexers 12 includes first and second multiplexers 121 and 122 as illustrated in FIG. 1. The RDL 10 is disposed on a system substrate 28 (not illustrated in FIG. 1). The decoupling capacitor structure 16 may connect the RDL 10 and the system substrate 28. The system substrate 28 is supported by a frame structure 20. A plurality of optical fiber connectors 21 are disposed on one side of the frame structure. The optical fiber connectors 21 may be an interface for the first and second optical fibers 151 and 152 to connect between an external device (e.g. a portable device) and one of a plurality of transceivers 14 on the second surface 10s2 of the RDL 10.

Figure 4:
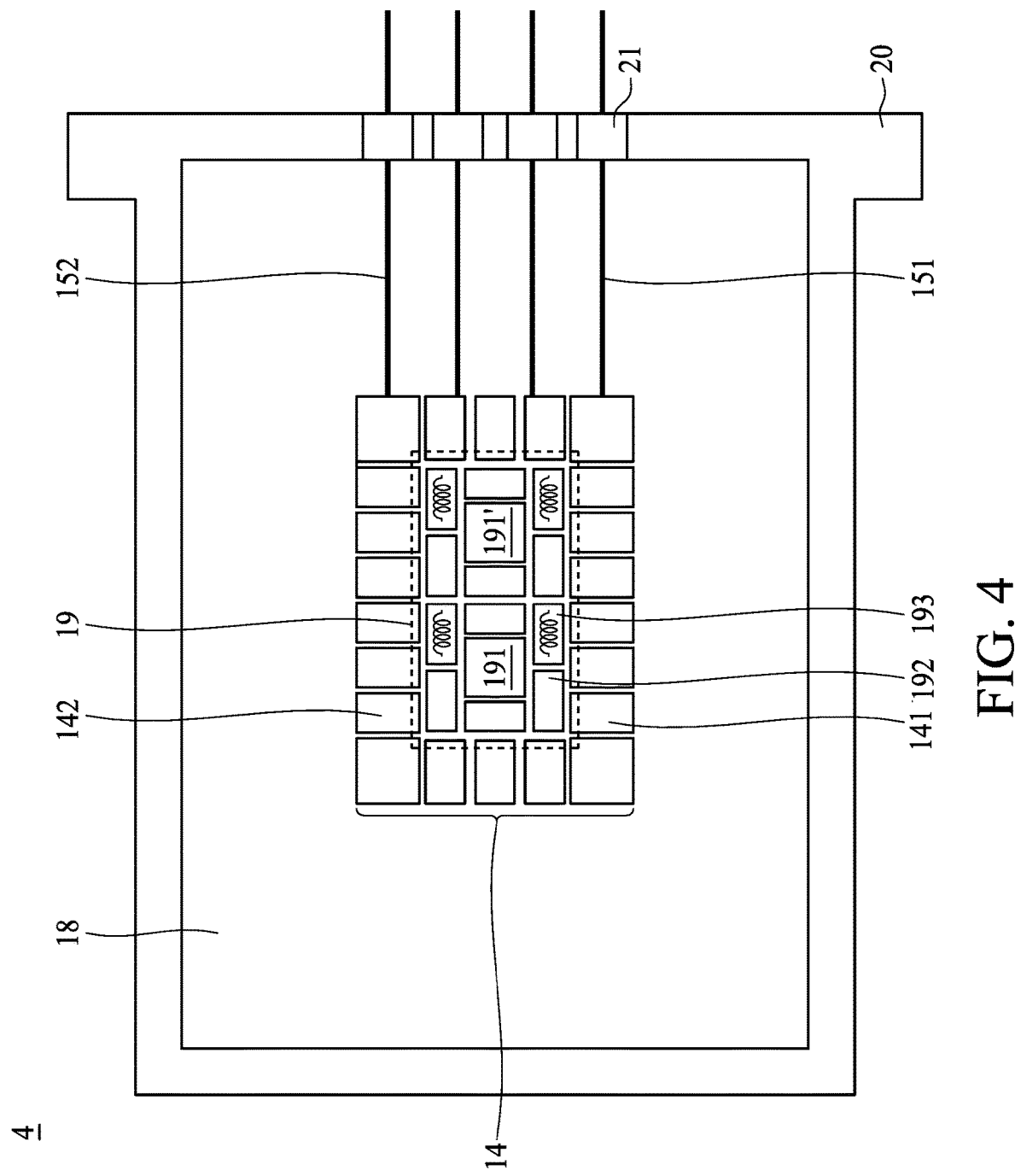
FIG. 4 illustrates a bottom view of another semiconductor device package in accordance with some embodiments of the present disclosure.

FIG. 4 illustrates a bottom view of another semiconductor device package 4 in accordance with some embodiments of the present disclosure. Referring to FIG. 4, the semiconductor device package 4 includes a power supply 191 and a power supply 191'. The power supplies 191 and 191' are each surrounded by the plurality of capacitors 192 and the plurality of inductors 193. A plurality of transceivers 14 surrounds the power management circuit 19 enclosed by dotted lines. The plurality of transceivers 14 includes the first and second transceivers 141 and 142 as illustrated in FIG. 2. The substrate 18 is supported by the frame structure 20. The plurality of optical fiber connectors 21 connects the first and second optical fibers 151 and 152 to an external device (e.g. a portable device). The first and second optical fibers 151 and 152 connect between the external device and the transceivers 14 disposed on the second surface 18s2 of the substrate 18. Furthermore, more optical fibers engaging the plurality of transceivers 14 can be connected to the external device via the plurality of optical fiber connectors 21.

FIG. 5A through FIG. 5E illustrate various stages of a method for manufacturing a semiconductor device package in accordance with some embodiments of the present disclosure.

Figure 5A:
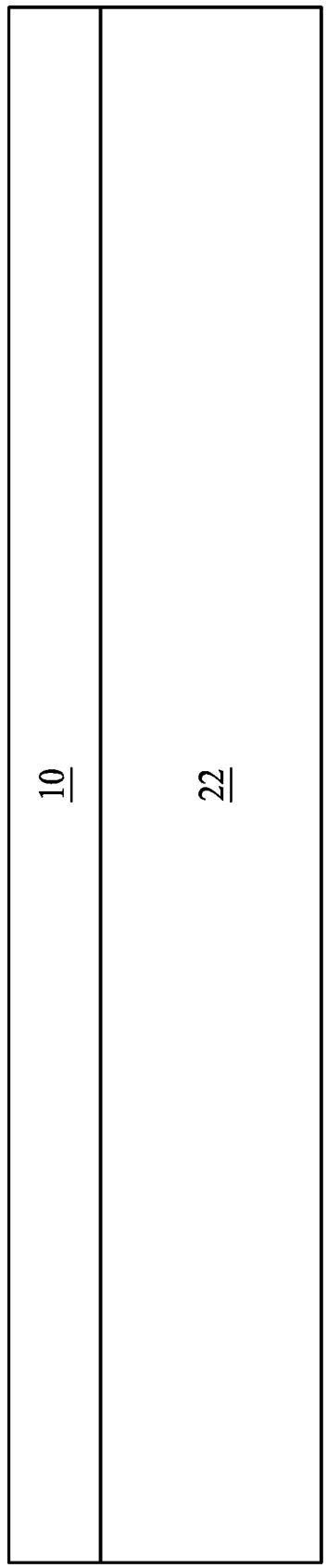
FIG. 5A, FIG. 5B, FIG. 5C, FIG. 5D, and FIG. 5E illustrate various stages of a method for manufacturing a semiconductor device package in accordance with some embodiments of the present disclosure.

Referring to FIG. 5A, a carrier 22 (e.g., a glass carrier) is provided. The carrier 22 may include a release layer. A redistribution layer (RDL) 10 is formed on the carrier 22.

Figure 5B:
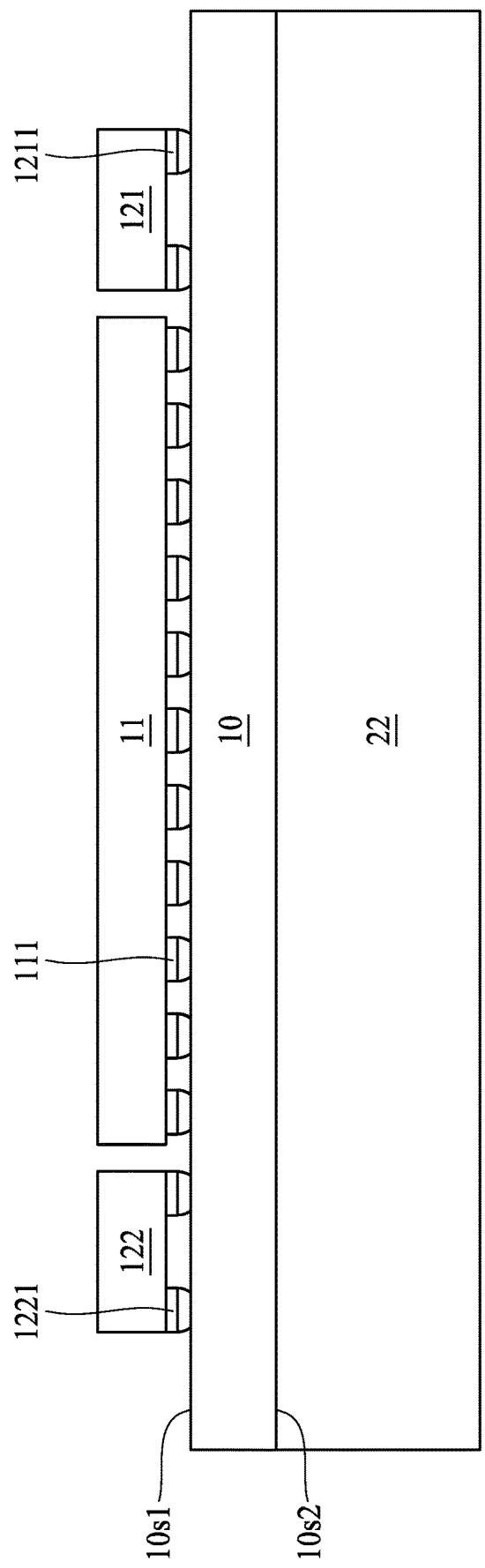

Referring to FIG. 5B, a semiconductor device 11 is bonded to a first surface 10$s$1 of the RDL 10 via a seventh conductive terminal 111. First and second multiplexers 121 and 122 are respectively attached to the RDL 10 via first and third conductive terminal 1211 and 1221. In some embodiments, the semiconductor device 11 is disposed between the first and second multiplexers 121 and 122.

Figure 5C:
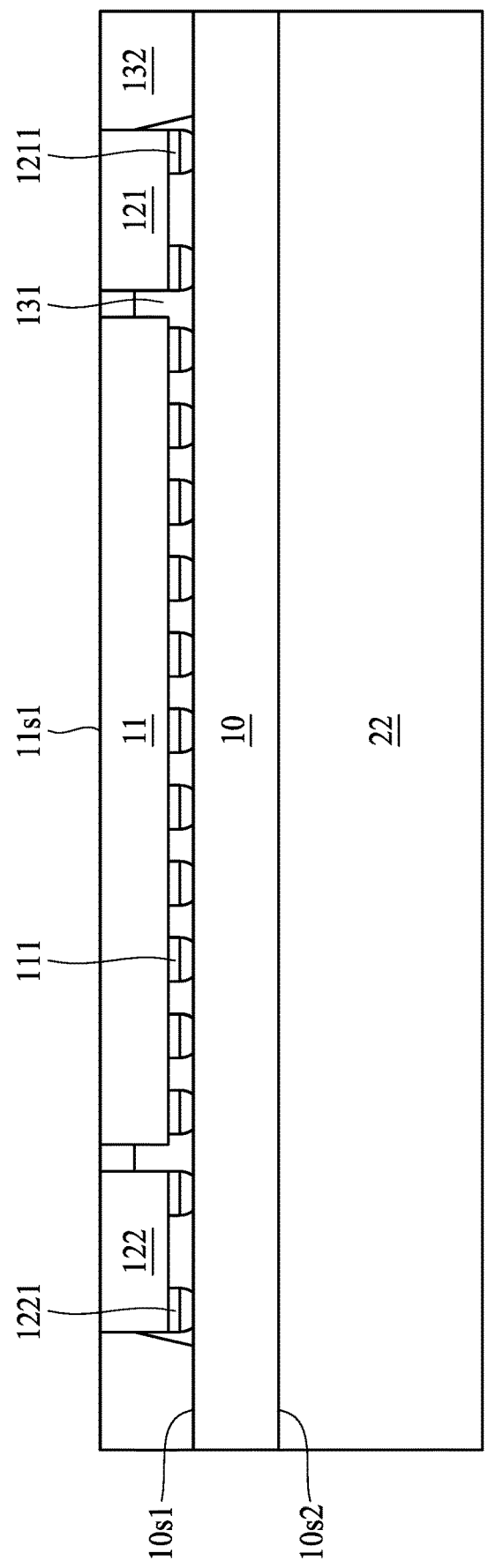
Figure 5D:
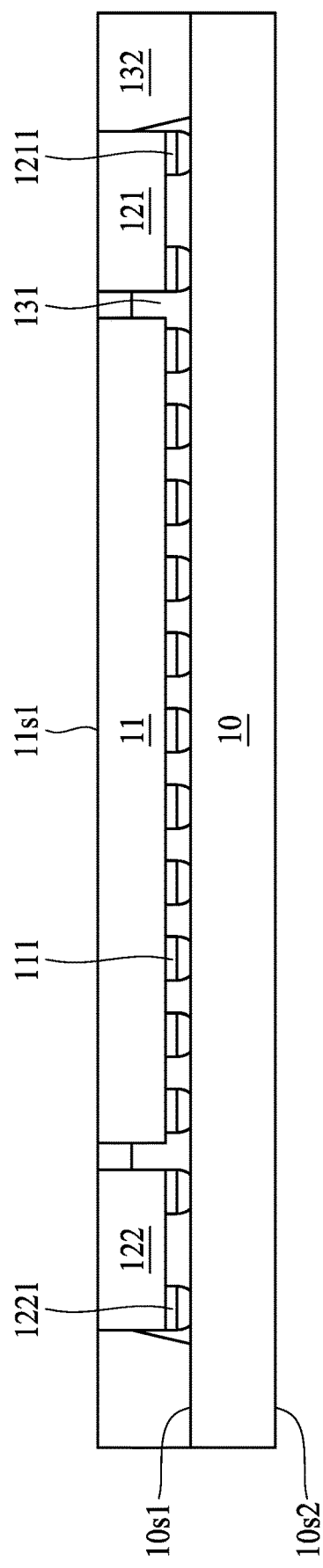

Referring to FIG. 5C, optionally, an underfill 131 is formed to surround the semiconductor device 11 and the first and second multiplexers 121 and 122. Subsequently, an encapsulant 132 encapsulates the semiconductor device 11, the first and second multiplexers 121 and 122, and the underfill 131. The encapsulant 13 is grinded to expose a first surface 11$s$1, or in some embodiments, a back surface or passive surface, of the semiconductor device 11. Referring to FIG. 5D, the carrier 22 is detached. A second surface 10$s$2 of the RDL 10 is exposed.

Figure 5E:
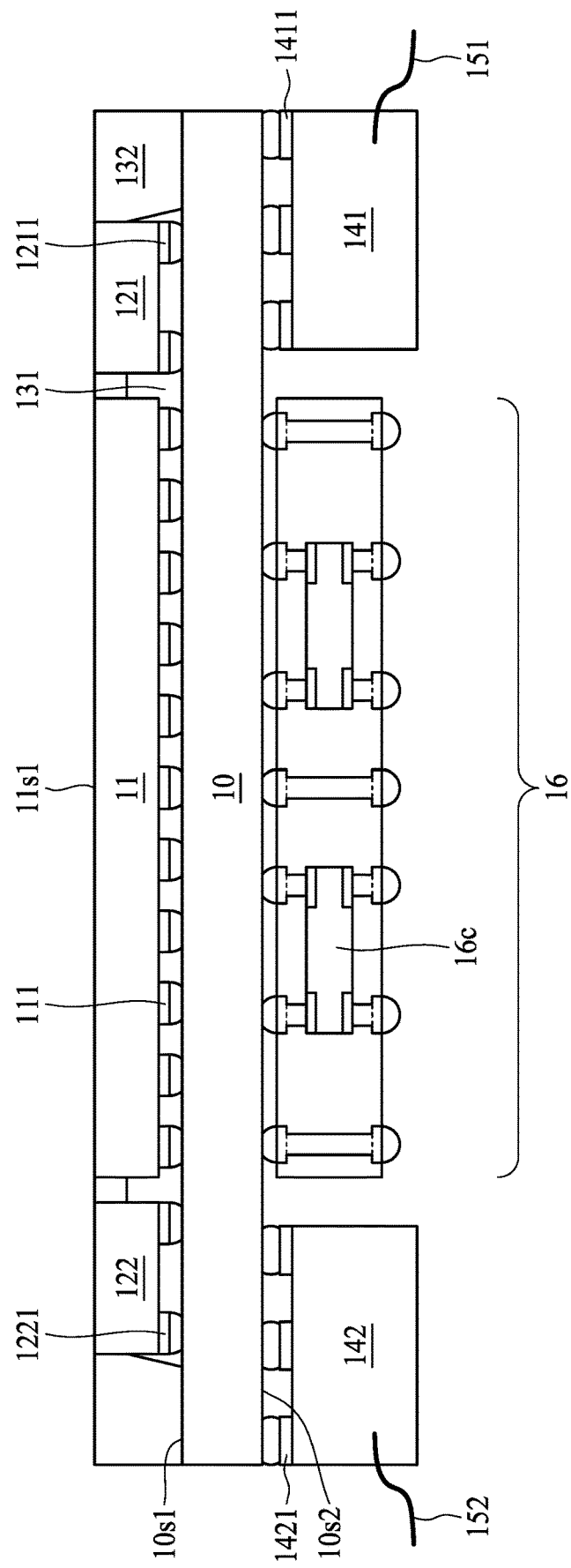

Referring to FIG. 5E, a decoupling capacitor structure 16 is bonded to the second surface 10$s$2 of the RDL 10. First and second transceivers 141 and 142 are respectively attached to the RDL 10 via second and fourth conductive terminal 1411 and 1421. First and second optical fiber are each engaged with the first and second transceivers 141 and 142, respectively. In some embodiments, the decoupling capacitor structure 16 is disposed between the first and second transceivers 141 and 142. The decoupling capacitor structure 16 includes capacitor 16$c$ over the second surface 10$s$2 of the RDL 10 and adjacent to the second transceiver 142. Afterwards, a heat dissipation structure 17 is formed on the first surface 11$s$1 of the semiconductor device 11 to form the semiconductor device package 1 as illustrated in FIG. 1.

Figure 6A:
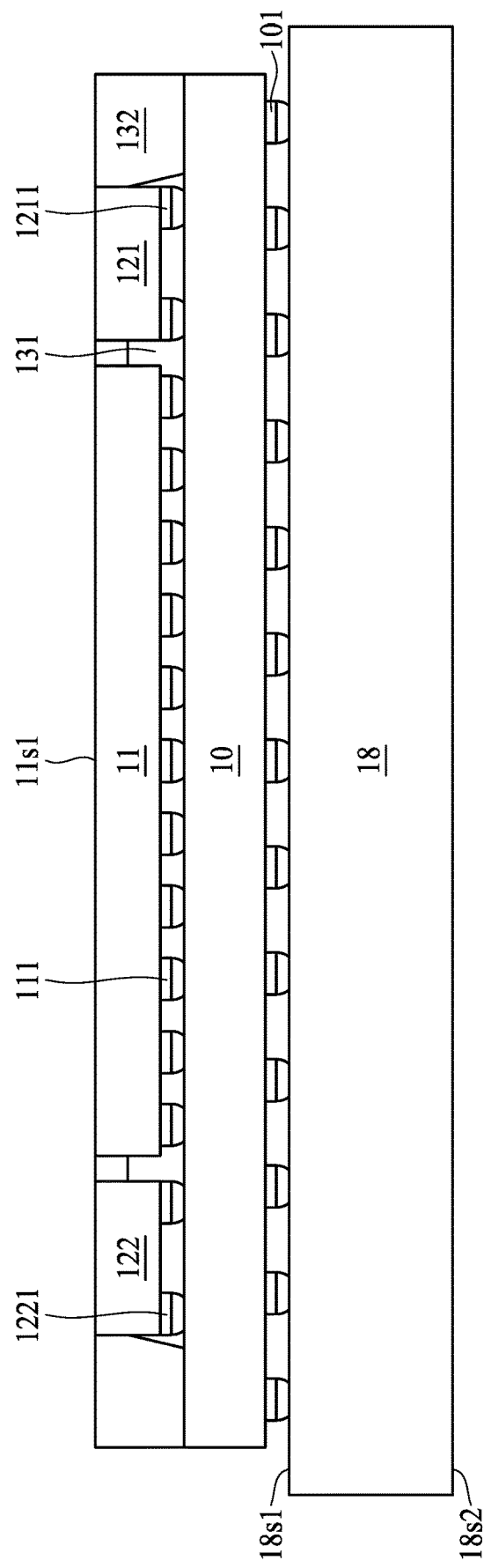
FIG. 6A and FIG. 6B illustrate various stages of another method for manufacturing a semiconductor device package in accordance with some embodiments of the present disclosure.
Figure 6B:
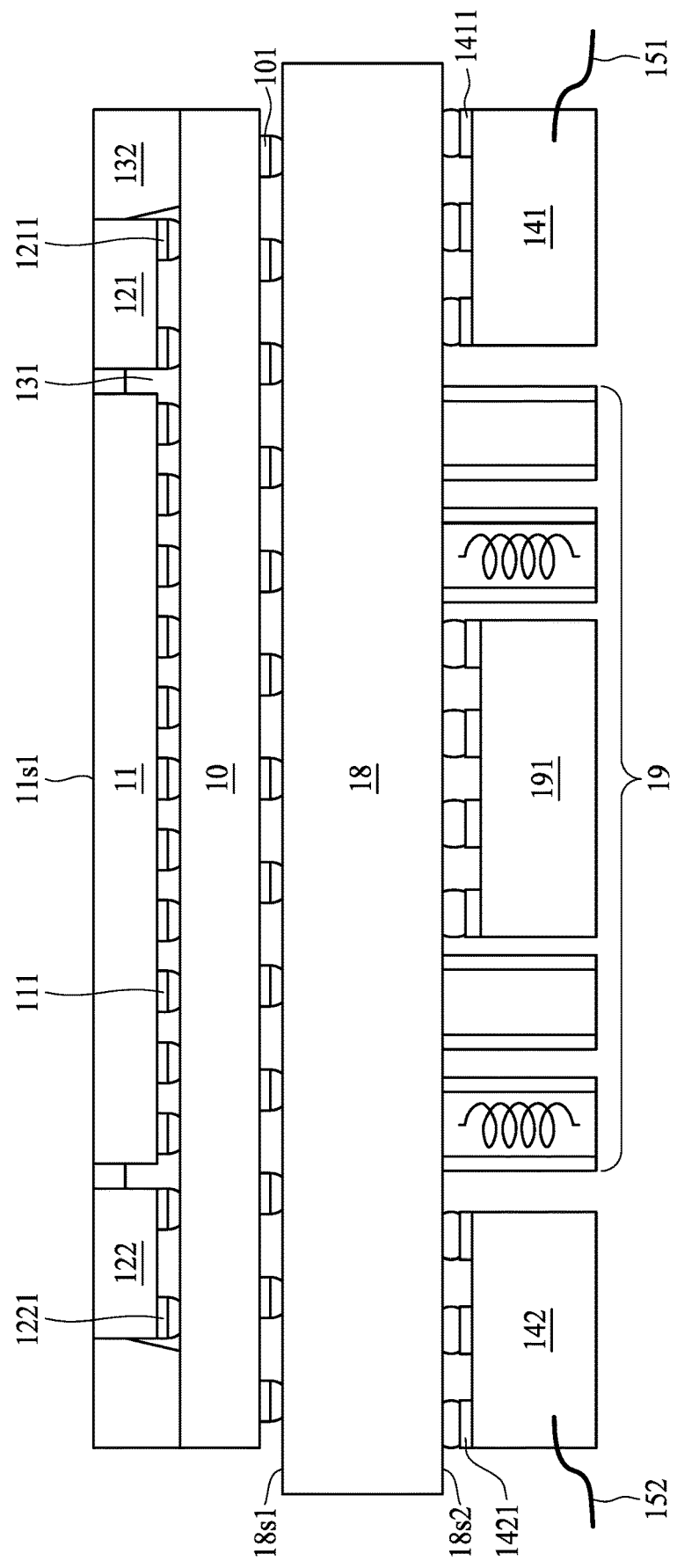

FIG. 6A and FIG. 6B illustrate various stages of another method for manufacturing a semiconductor device package in accordance with some embodiments of the present disclosure.

Referring to 6A, after forming the encapsulant 132 and removing the carrier 22 in the stage as illustrated in FIG. 5C and FIG. 5D, the RDL 10 is disposed over a first surface 18$s$1 of a substrate 18. The semiconductor device 10 is disposed on the first surface 10$s$1 of the RDL 10 through a seventh conductive terminal 111. The RDL 10 is disposed over the first surface 18$s$1 of the substrate 18 through an eighth conductive terminal 101. The seventh conductive terminal 111 is finer than the eighth conductive terminal 101. In some embodiments, the seventh conductive terminal 111 may have a pitch of 130 μm and the eighth conductive terminal may have a pitch of 300 μm.

Referring to 6B, a power management circuit 19 is disposed on a second surface 18$s$2 of the substrate 18. The power management circuit 19 includes a power supply 191 providing power to the semiconductor device 11, the first and second multiplexers 121, 122, the first and second transceivers 141, 142. Afterwards, a heat dissipation structure (not illustrated in FIG. 6B) is formed on the first surface 11$s$1 of the semiconductor device 11 to form the semiconductor device package 2 as illustrated in FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
a substrate having a first surface and a second surface opposite to the first surface;
a redistribution layer (RDL) disposed on the first surface of the substrate;
a semiconductor device disposed on the RDL;
a transceiver disposed on the second surface of the substrate;
a power supply disposed on the second surface of the substrate; and
an optical fiber engaged with the transceiver,
wherein the power supply is electrically connected to the semiconductor device and the transceiver through the substrate a decoupling capacitor structure disposed on the second surface of the substrate, wherein the decoupling capacitor structure comprises a capacitor electrically connected with the semiconductor device.

2. The semiconductor device package of claim 1, wherein the semiconductor device has a first projected area, and the power supply has a second projected area, the first projected area overlapping with the second projected area.

3. The semiconductor device package of claim 1, further comprising a plurality of capacitors and a plurality of inductors disposed on the second surface of the substrate and being surrounding the power supply.

4. The semiconductor device package of claim 3, wherein the plurality of capacitors and the plurality of inductors regulates an output voltage of the power supply.

5. The semiconductor device package of claim 3, wherein the capacitors comprises surface mounted device (SMD) capacitors.

6. The semiconductor device package of claim 1, wherein the power supply provides power to the semiconductor device via the substrate and the RDL.

7. The semiconductor device package of claim 1, wherein the semiconductor device comprises a multiplexer disposed over the substrate and at least partially overlapping with the transceiver in a vertical direction.

8. The semiconductor device package of claim 7, wherein an electrical transmission path between the multiplexer and the transceiver is less than 1 cm.

9. The semiconductor device package of claim 1, further including a decoupling capacitor structure disposed on the second surface of the substrate, wherein the decoupling capacitor structure comprises a capacitor electrically connected with the semiconductor device.

10. The semiconductor device package of claim 9, wherein the decoupling capacitor structure comprises a first conductive element, wherein the first conductive element connects the capacitor to the RDL.

11. The semiconductor device package of claim 10, wherein the decoupling capacitor structure further comprises a dielectric layer and a second conductive element, wherein the second conductive element extends through the dielectric layer.

12. The semiconductor device package of claim 1, further comprising a heat dissipation structure disposed on the semiconductor device, wherein the heat dissipation structure comprises a planar bottom profile.

13. The semiconductor device package of claim 1, wherein the RDL has a first surface facing away from the substrate and a second surface facing toward the substrate, and wherein a conductive terminal proximal to the first surface of the RDL is finer than a conductive terminal proximal to the second surface of the RDL.

14. The semiconductor device package of claim 1, wherein the semiconductor device includes a switch processor.

15. The semiconductor device package of claim 1, further comprising a frame structure, wherein the substrate is supported by the frame structure.

16. The semiconductor device package of claim 1, further comprising a plurality of multiplexers disposed on the RDL and surrounding the semiconductor device.

17. The semiconductor device package of claim 1, wherein a power transmission path between the semiconductor device and the power supply is less than 1 cm.

18. The semiconductor device package of claim 1, wherein the power supply, the plurality of capacitors, and the plurality of inductors consists of a power management circuit.

19. The semiconductor device package of claim 1, further comprising an optical fiber connector as an interface for the optical fiber to connect with the transceiver.

* * * * *